United States Patent [19]

O'Shea

[11] 4,214,210
[45] Jul. 22, 1980

[54] ELECTROMAGNETIC NOISE SOURCE LOCATOR

[75] Inventor: Martin W. O'Shea, Manchaug, Mass.

[73] Assignee: Sprague Electric Company, North Adams, Mass.

[21] Appl. No.: 868,020

[22] Filed: Jan. 9, 1978

[51] Int. Cl.$^2$ .................... H04B 1/18; H04B 17/00
[52] U.S. Cl. .................................. 455/282; 324/72; 343/703
[58] Field of Search .............. 325/27, 29, 43, 67, 325/363, 364, 325, 377, 379, 386, 313; 324/72, 72.5, 102; 343/701, 703; 340/540, 659

[56] References Cited

U.S. PATENT DOCUMENTS

| | | | |
|---|---|---|---|
| 2,139,474 | 12/1938 | Shepard, Jr. | 324/102 |
| 2,196,590 | 4/1940 | Koch | 343/703 |
| 2,268,639 | 1/1942 | Braden | 343/701 |
| 2,499,410 | 3/1950 | Nupp | 325/386 |
| 3,296,527 | 1/1967 | Cones | 324/72.5 |
| 3,465,253 | 9/1969 | Rittenbach | 325/364 |
| 3,639,841 | 2/1972 | Richardson | 325/364 |
| 3,691,459 | 9/1972 | Anderson | 343/703 |
| 3,820,018 | 6/1974 | Beasley et al. | 325/363 |
| 4,008,477 | 2/1977 | Babij et al. | 343/701 |

FOREIGN PATENT DOCUMENTS 339859  12/1930  United Kingdom .................. 325/363

*Primary Examiner*—Marc E. Bookbinder
*Attorney, Agent, or Firm*—Connolly and Hutz

[57] ABSTRACT

An electromagnetic noise source locator is comprised of an audio amplifier which is connected to drive a speaker and to which is connected at the input a series circuit that includes a very small antenna loop of area less than 1 in$^2$, a diode and a capacitor. This apparatus responds only to bursts of radiated energy and furthermore responds only to such bursts having frequency components over about 1 GHz. It is therefore particularly suitable for the selective sensing and location of sparking gaps as may occur on power lines.

6 Claims, 6 Drawing Figures

U.S. Patent  Jul. 22, 1980  4,214,210
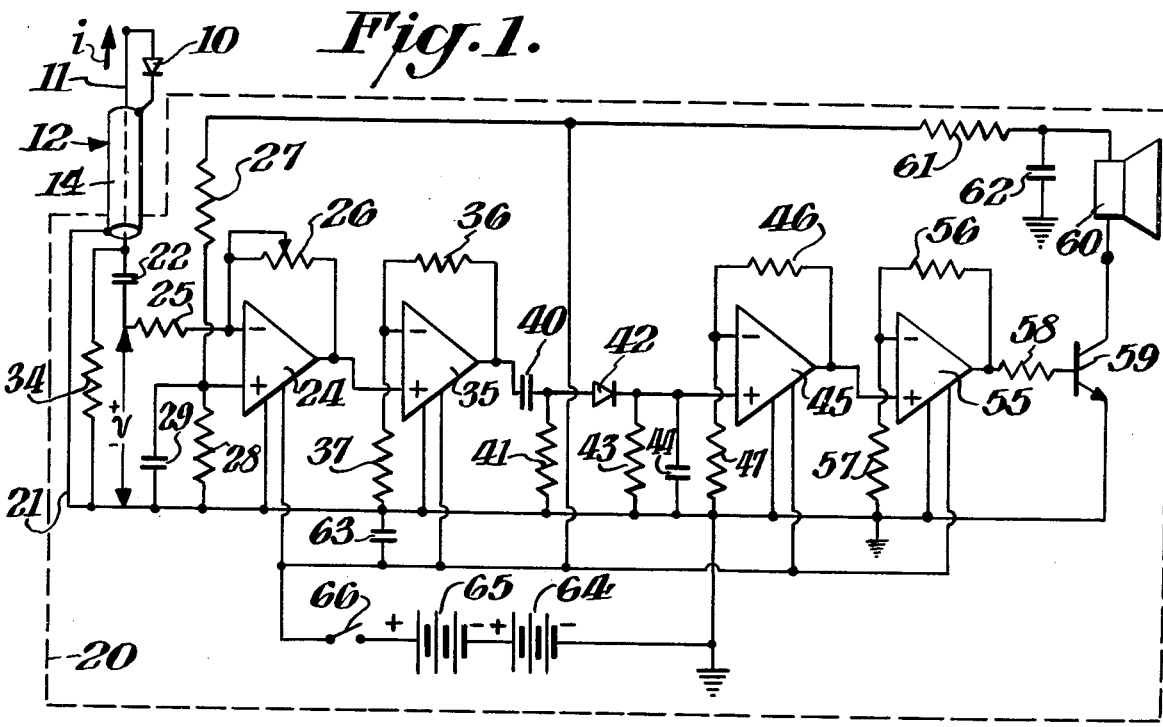
Fig.1.
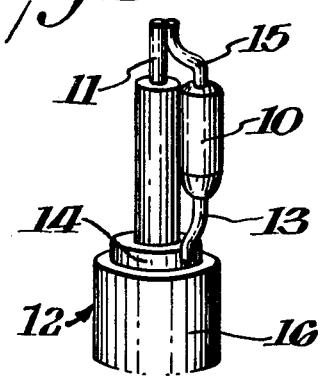
Fig.2.
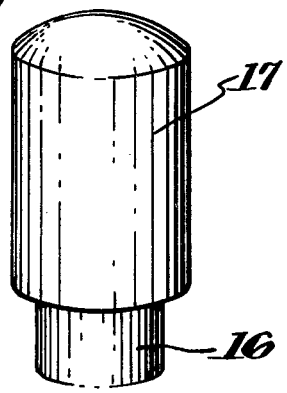
Fig.3.
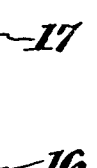
Fig.6.
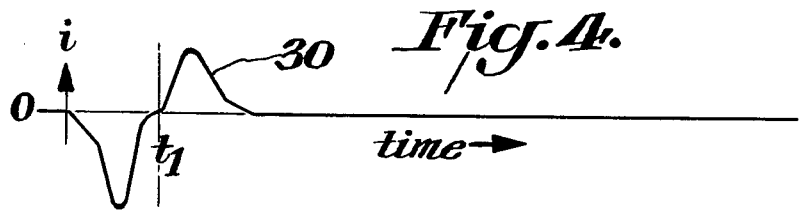
Fig.4.
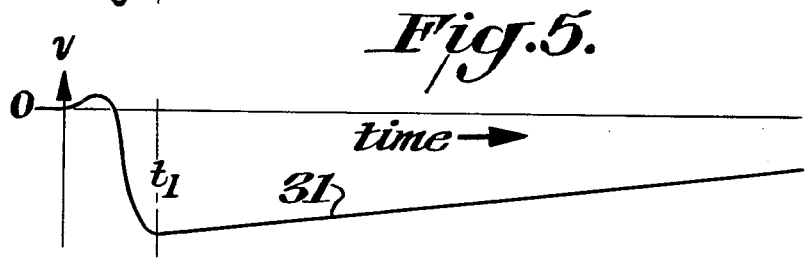
Fig.5.
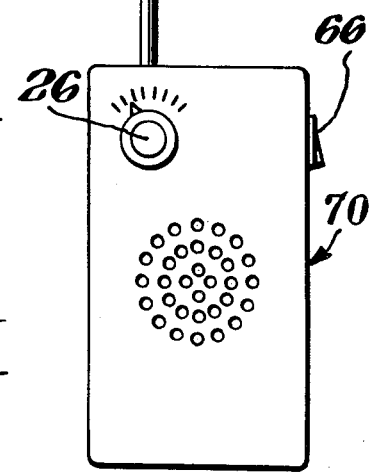

ELECTROMAGNETIC NOISE SOURCE LOCATOR

BACKGROUND OF THE INVENTION

This invention relates to an apparatus for locating the source of electromagnetic noise radiation, and more particularly to such an apparatus for determining the location of sparking in electrical equipment.

Electrical arcs or sparking gaps constitute a prevalent source of radio interference or noise. Typical of such sources are the sparking of the brushes in an electric motor, of defective contacts in an electric switch, of automobile ignition systems and of loose hardware on an electric utility pole.

The electromagnetic fields generated by such sparking are characterized as bursts of radiated energy consisting of a very broad band of radio frequencies and each burst having a fast rise time, typically being on the order of a nanosecond.

Radio noise-source locators of the prior art are comprised of a radio receiver that is tunable to one frequency (or to one narrow band of frequencies) at a time. This tunable feature makes it possible to sense electromagnetic noise of all kinds ranging from single frequency continuous wave signals to very broad band or white noise, either or which may or may not be modulated. One such noise source locator is described in U.S. Pat. No. 3,965,425 issued June 22, 1976 and assigned to the same assignee as the present invention.

Although such noise source locators of the prior art are capable of sensing electrical sparking, they do so by sensing only a small portion of the broad spectrum of frequencies radiated. Many stages of signal amplification are thus usually required to produce a usable indication of broad band sources (e.g. RF, IF and audio amplifier stages). Furthermore the receiver must be tuned away from other sources of noise such as local radio or television stations. Such locators thus tend to be large, complex and costly in addition to requiring a trained operator in their use.

It is accordingly an object of the present invention to provide a simple low cost apparatus capable of selectively sensing radiated fields from electrical arcs.

It is a further object of this invention to provide such a locator that senses a broad frequency spectrum of radiated noise and requires no tuning.

It is a further object of the present invention to provide such a locator that is insensitive to continuous wave signals such as those generated by television and radio stations.

It is yet a further object of this invention to provide an electromagnetic noise source locator that is selectively responsive to sparking.

SUMMARY OF THE INVENTION

An apparatus for locating the source of electro-magnetic noise is comprised of an indicator means such as a speaker, an audio amplifier that may be made up of a plurality of tandem connected amplifier stages, and an r.f. antenna-detector means. The latter is comprised of a conductive loop, a diode and a capacitor, all of which are connected to form a series circuit. This series circuit is connected across the input of the amplifier.

The series circuit preferably includes a short length of coaxial cable having the loop connected across its two conductors at the remote end thereof to physically space the antenna loop from the rest of the apparatus to which it is fixedly attached. The loop preferably has an area that is less than about 1 square inch (0.65 square centimeters). This small loop at the remote end of a length of cable makes it possible to locate the sparking gap with high resolution at very close range, such as within a few inches, by moving the whole apparatus including the antenna so as to obtain the greatest detected signal. Also, an antenna loop having an area less than 1 square inch is maximally effective as an antenna only for frequencies of electro-magnetic radiation that are greater than about 1 GHz ($10^9$ Hz). A large part of the radiated energy of sparking gap noise sources is in this high frequency region while radiated corona energy is almost entirely in a band below 1 GHz. Thus, radiated energy from corona and from most "single frequency" radio and television transmitters is essentially excluded from detection by the apparatus of this invention.

Since the detected frequencies are so high, determination of the direction of a gap noise source from the locator apparatus is easily accomplished by positioning the hand or the body of the operator about the loop antenna so as to shield it from the source and minimize the strength of the signal received and detected. By moving the locator in the indicated direction toward the source, the signal will become stronger. Little skill and experience is required of an operator to use this instrument to pin-point the location of a sparking gap.

Other distinctive features of the apparatus of this invention are the absence of any tuning means, and the absence of any radio frequency stages of amplification. More positively stated, the antenna is directly connected to the detector circuit, which circuit is directly connected to the input of an audio amplifier, leading to a very simple low cost gap noise locator apparatus.

The locator of this invention may provide even further rejection of single frequency signals which are almost always of a continuing wave character by inclusion of a current-pulse integrator circuit that senses only fast rising bursts of radiated noise. Such fast rise bursts are a prominent feature of sparking noise sources, the repetition rate of such bursts being most frequently found in the audio spectrum, and typically being at power line frequencies (e.g. 60 Hz). The provision of a pulse stretcher feature in the locator of this invention may be included to magnify the audible energy in the differentiated bursts. Such a pulse stretcher circuit also provides a recovery time feature limiting the rate, preferably to audio frequencies or below, at which integrated and stretched bursts are presented to an electroacoustic transducer or other means for indicating the presence of an electrical signal.

BRIEF DESCRIPTION OF THE DRAWING

FIG. 1 shows a schematic diagram of a gap-noise locator of this invention.

FIG. 2 shows in perspective view the loop antenna of the locator of FIG. 1.

FIG. 3 shows in perspective view the antenna of FIG. 1 having a protective insulative cap mounted thereover.

FIG. 4 shows the wave form of current that is typically induced in a conventional antenna from a sparking gap.

FIG. 5 shows the wave-form of voltage that is produced at the input of the amplifier of FIG. 1 in response to a sparking gap such as that referred to in FIG. 4.

FIG. 6 shows in front view the locator of this invention.

DESCRIPTION OF THE PREFERRED EMBODIMENT

In the diagram of a locator of this invention of FIG. 1, the antenna consists of a diode 10 and a series connected wire 11 that form a loop at the end of a coaxial cable 12. This assembly as shown in FIG. 2 wherein one diode lead 13 is connected to the cylindrical outer conductor 14 of the cable 12, and the other diode lead 15 is connected to the center wire conductor 11 of the coaxial cable 12. The cable 12 is enclosed within a rigid phenolic tube 16. A plastic cap 17, as seen in FIG. 3, encloses the loop antenna and is attached to the phenolic tube 16.

With further reference to FIG. 1, outer shielding conductor 14 of the cable 12 is connected to a metal case 20 that encloses the remaining electronic elements of the noise locator. The case 20 is further connected to the ground system of the enclosed electronic circuit, although this connection 21 is not essential.

The lower end of cable conductor 11 is connected to a capacitor 22 that is in turn connected to the input of a first amplifier circuit stage comprised of an operational amplifier 24 having gain determining resistors 25 and 26. The resistor 26 is operator variable permitting operator adjustment in the gain of this stage. Resistors 27 and 28 form a bias network for the (+) input terminal of operational amplifier 24. Capacitor 29 bypasses audio and/or r.f. signals to ground.

When the antenna is in the field of a sparking gap, the current 30 that is induced in the antenna loop typically has the form shown in FIG. 4 in response to a burst of r.f. energy generated in the gap. However, only the negative going portion of the current actually flows since current in the other direction is blocked by the diode 10. The capacitor 22 passes this unidirectional pulse and a negative voltage, v, is applied to the input of the first amplifier stage. The wave-form 31 of the voltage pulse v is indicated in FIG. 5. On the other hand, any continuous wave signal picked up by the antenna is rectified by the diode producing a DC voltage and is subsequently blocked by the capacitor 22. The locator therefore senses only bursts of radiated energy.

Returning to the diagram of FIG. 1, the resistor 34 provides a path for the discharge of capacitor 22 after each current pulse. This resistor is not essential in practice since the diode 10 will usually have a reverse leakage current characteristic that provides the non-critical high impedance discharge path. Immediately after $t_1$ when the diode 10 becomes back biased, the capacitor 22 having been charged begins to discharge through the input of the amplifier generating a negative voltage 31 which will decay to zero in on the order of milliseconds since the discharge path of capacitor 22 has a resistance on the order of megohms consisting of the input resistance of the first amplifier stage and the resistor 34. This negative "step pulse" is rich in audio frequency energy and is amplified by the operational amplifier 24, as well as by a second and succeeding stage that is made up of operational amplifier 35 and the associated resistors 36 and 37.

This second stage is followed by a circuit consisting of a capacitor 40, a resistor 41, a diode 42, another resistor 43 and another capacitor 44. These components form a standard pulse stretching circuit. The diode additionally provides a threshold of about half a volt above which the pulse signal will be passed to a third amplifier stage.

The third amplifier consists of an operational amplifier 45 and resistors 46 and 47 and is followed by a fourth amplifier stage consisiting of an operational amplifier 55 and resistors 56 and 57.

The signal then passes through resistor 58 to a power transistor 59 having a permanent magnet type speaker 60 connected as the load in the collector circuit of transistor 59.

A filter network made up of resistor 61 and capacitor 62 isolate the $+V_{cc}$ power line from the speaker at signal frequencies. Another $+V_{cc}$ filter capacitor 63 is connected across the d.c. power supply which consists of two batteries 64 and 65. A power switch 65 is connected in series with the batteries.

The locator apparatus 70 appears as shown in FIG. 6 having side mounted switch 66 and gain control 26 mounted to the case 20. The case is easily held in the hand measuring 4.4 inches (11.2 cm) high, 2.2 inches (5.6 cm) wide and 1.1 inches (2.8 cm) deep. The antenna and cable tube 16 extend upwardly about 5 inches (12.7 cm) from the case.

The four operational amplifiers 24, 35, 45 and 55 are all included in a single integrated circuit, part no. LM 224D made by National Semiconductor Corp. The two diodes are each type 1N34 A. The transistor 59 is a power-darlington part no. TIP 110 made by Texas Instruments Corp. The resistors are all rated at ¼ watt. The batteries 64 and 65 are each 9 volt dry cells.

Other components data are given in Table 1 below:

Table 1

| Resistors | (ohms) |
| --- | --- |
| 25, 58 | 1 K |
| 26, 37, 43, 47, 57 | 100 K |
| 27, 36, 46, 56 | 1 Meg |
| 28 | 10 K |
| 41 | 10 Meg |
| 61 | 56 |

| Capacitors | (ufd.) |
| --- | --- |
| 22 | .001 |
| 29 | 4.7 |
| 40 | .01 |
| 44 | .01 |
| 62 | 50. |
| 63 | 350. |

The sharp raspy sounds that are produced by this locator when sensing sparking gap noise may be heard by an operator in the open field many tens of feet away. Thus when this small locator is mounted at the end of an insulated "hot stick" and maneuvered from the ground in the vicinity of a sparking gap high above the ground on a high voltage power line, the operator is alerted by these sharp sounds to the fact that the sparking gap is being approached. Noise locators of the prior art are larger, heavier and have a more bulky antenna and it is not practical to mount them in a similar manner to the end of a "hot stick". The location of a sparking gap in this manner is advantageously accomplished speedily and with heretofore unknown precision.

The upward extending portion of the wire 11 that forms a part of the loop antenna is about ½ inch long and the loop area is about 0.075 square inches (0.48 square centimeters). The length of the cable 12 is not at all critical and in fact the cable length may be reduced to zero (cable omitted) without substantially altering the sensitivity of the locator.

Furthermore, a wire may be substituted for the diode 10, and the diode 10 reconnected in series with capacitor 22 at the lower end of the cable. Although the locator still functions under these conditions, for reasons not understood, the sensitivity is reduced by about fifty percent. Thus it is preferred that the diode form a part of the loop antenna.

The maximum amplification provided by the four audio amplifier stages which include operational amplifiers 24, 35, 45 and 55 is 1000.

As has been noted, the detection and location of broad band electromagnetic interference sources has been achieved heretofore by tuning to a small portion of the frequency spectrum whereby detection of radio, television and other prevalent electromagnetic fields is excluded ("tuned out") and by providing high amplification to the narrow band of signals being received. Contrarywise, the technique of the present invention includes receiving and detecting a broad band of radiated energy whereby a large portion of the spectrum of radiated energy from a sparking gap noise source is detected avoiding the need for high amplification. The "tuning-out" of narrow spectrum (essentially single frequency) sources such as radio and television signals is therefore less important since the relative energy in an unwanted single frequency compared to that in a wanted noise source is greatly reduced. Further, many such single frequency sources are excluded from detection in the locator of this invention by providing a very small loop antenna that effectively picks up only radiated energy having frequency components above about 1 GHz in which range a substantial amount of energy is radiated from sparking noise sources.

What is claimed is:

1. An apparatus for locating the source of sparking electromagnetic noise radiation comprising:
   (a) an indicator means for producing an indication of the presence of an electrical signal;
   (b) an audio amplifier, an output thereof being electrically connected to said indicator means; and
   (c) an r.f. antenna-detector means comprising a conductive loop, a diode, a capacitor and a coaxial cable that has a center conductor and a cylindrical outer conductor, said loop having an area of less than 1 square inch and being connected between said conductors at one end of said cable with said diode forming a part of said loop; said loop, said diode, said capacitor and said cable conductors forming a series circuit which is connected across the input of said audio amplifier.

2. The apparatus of claim 1 wherein said amplifier and the portion of said antenna-detector means that is connected between said amplifier input and said cable are enclosed in a metal case.

3. The apparatus of claim 1 wherein said amplifier is comprised of a plurality of audio amplifier stages being connected in tandem, said amplifier including a gain adjusting means for permitting manual adjustment of the gain of said amplifier.

4. The apparatus of claim 1 additionally comprising a pulse stretching means for widening signal pulses that pass through said amplifier.

5. The apparatus of claim 1 wherein said indicator means is an electro-acoustic transducer.

6. The apparatus of claim 1 additionally comprising a signal threshold means in said amplifier for passing only signals having a magnitude greater than a certain threshold voltage.

* * * * *